United States Patent
Ravkin et al.

(10) Patent No.: US 7,383,843 B2
(45) Date of Patent: *Jun. 10, 2008

(54) METHOD AND APPARATUS FOR PROCESSING WAFER SURFACES USING THIN, HIGH VELOCITY FLUID LAYER

(75) Inventors: Michael Ravkin, Sunnyvale, CA (US); Michael G. R. Smith, Dublin, CA (US); John M. de Larios, Palo Alto, CA (US); Fritz Redeker, Fremont, CA (US); Mikhail Korolik, San Jose, CA (US); Christian DiPietro, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 602 days.

This patent is subject to a terminal disclaimer.

(21) Appl. No.: 10/882,835

(22) Filed: Jun. 30, 2004

(65) Prior Publication Data
US 2005/0145265 A1    Jul. 7, 2005

Related U.S. Application Data

(63) Continuation-in-part of application No. 10/817,355, filed on Apr. 1, 2004, which is a continuation-in-part of application No. 10/261,839, filed on Sep. 30, 2002, now Pat. No. 7,234,477.

(51) Int. Cl.
*B08B 3/00* (2006.01)
*F26B 5/04* (2006.01)

(52) U.S. Cl. .................. 134/95.2; 134/99.1; 134/902; 34/407

(58) Field of Classification Search ............... 134/95.1, 134/95.2, 99.1, 102.3, 167 R, 198, 902; 34/407
See application file for complete search history.

(56) References Cited

U.S. PATENT DOCUMENTS 3,953,265 A     4/1976    Hood (Continued)

FOREIGN PATENT DOCUMENTS

EP        0 905 746 A1     3/1999

(Continued)

OTHER PUBLICATIONS

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

(Continued)

*Primary Examiner*—Joseph L. Perrin
(74) *Attorney, Agent, or Firm*—Martine Penilla & Gencarella, LLP

(57) ABSTRACT

Among the many embodiment, in one embodiment, a method for processing a substrate is disclosed which includes generating a fluid layer on a surface of the substrate, the fluid layer defining a fluid meniscus. The generating includes moving a head in proximity to the surface, applying a fluid from the head to the surface while the head is in proximity to the surface of the substrate to define the fluid layer, and removing the fluid from the surface through the proximity head by a vacuum. The fluid travels along the fluid layer between the head and the substrate at a velocity that increases as the head is in closer proximity to the surface.

17 Claims, 11 Drawing Sheets

U.S. PATENT DOCUMENTS

| | | | |
|---|---|---|---|
| 4,086,870 A | 5/1978 | Canavello et al. | |
| 4,367,123 A | 1/1983 | Beck | |
| 4,444,492 A | 4/1984 | Lee | |
| 4,838,289 A | 6/1989 | Kottman et al. | 134/153 |
| 5,102,494 A | 4/1992 | Harvey et al. | |
| 5,180,431 A | 1/1993 | Sugimoto et al. | |
| 5,271,774 A | 12/1993 | Leenaars et al. | |
| 5,294,257 A | 3/1994 | Kelly et al. | |
| 5,343,234 A | 8/1994 | Kuehnle | |
| 5,361,449 A | 11/1994 | Akimoto | |
| 5,472,502 A | 12/1995 | Batchelder | |
| 5,558,111 A | 9/1996 | Lofaro | |
| 5,601,655 A | 2/1997 | Bok et al. | |
| 5,660,642 A | 8/1997 | Britten | |
| 5,705,223 A | 1/1998 | Bunkofske | 427/240 |
| 5,709,757 A | 1/1998 | Hatano et al. | |
| 5,807,522 A | 9/1998 | Brown et al. | |
| 5,830,334 A | 11/1998 | Kobayashi | |
| 5,882,433 A | 3/1999 | Ueno | |
| 5,893,004 A | 4/1999 | Yamamura | |
| 5,945,351 A | 8/1999 | Mathuni | 438/706 |
| 5,975,098 A | 11/1999 | Yoshitani et al. | |
| 5,989,478 A | 11/1999 | Ouellette et al. | |
| 5,997,653 A | 12/1999 | Yamasaka | 134/2 |
| 6,086,454 A | 7/2000 | Watanabe et al. | |
| 6,092,937 A | 7/2000 | Snodgrass et al. | |
| 6,103,636 A | 8/2000 | Zahorik et al. | |
| 6,108,932 A | 8/2000 | Chai | |
| 6,132,586 A | 10/2000 | Adams et al. | |
| 6,214,513 B1 | 4/2001 | Cai et al. | |
| 6,230,722 B1 | 5/2001 | Mitsumori et al. | |
| 6,341,998 B1 | 1/2002 | Zhang | |
| 6,391,166 B1 | 5/2002 | Wang | |
| 6,398,975 B1 | 6/2002 | Mertens et al. | 216/92 |
| 6,417,117 B1 | 7/2002 | Davis | |
| 6,433,541 B1 | 8/2002 | Lehman et al. | |
| 6,446,358 B1 | 9/2002 | Mitsumori et al. | |
| 6,474,786 B2 | 11/2002 | Percin et al. | |
| 6,488,040 B1 | 12/2002 | De Larios et al. | |
| 6,491,764 B2 | 12/2002 | Mertens et al. | 134/36 |
| 6,495,005 B1 | 12/2002 | Colgan et al. | |
| 6,514,570 B1 | 2/2003 | Matsuyama et al. | |
| 6,530,823 B1 | 3/2003 | Ahmadi et al. | |
| 6,531,206 B2 | 3/2003 | Johnston et al. | |
| 6,550,988 B2 | 4/2003 | Sugimoto et al. | |
| 6,555,017 B1 | 4/2003 | Rushford et al. | |
| 6,616,772 B2 | 9/2003 | De Larios et al. | |
| 6,629,540 B2 | 10/2003 | Mitsumori et al. | |
| 6,689,323 B2 | 2/2004 | Fisher et al. | |
| 6,764,720 B2 | 7/2004 | Pui et al. | |
| 6,799,584 B2 | 10/2004 | Yogev et al. | |
| 6,954,993 B1 | 10/2005 | Smith et al. | |
| 6,988,326 B2 | 1/2006 | O'Donnell et al. | |
| 6,988,327 B2 | 1/2006 | Garcia et al. | |
| 7,000,622 B2 | 2/2006 | Woods et al. | |
| 2002/0020622 A1 | 2/2002 | Hanson et al. | |
| 2002/0121290 A1 | 9/2002 | Tang et al. | |
| 2002/0125212 A1 | 9/2002 | Mertens et al. | |
| 2003/0091754 A1 | 5/2003 | Chihani et al. | |
| 2003/0092264 A1 | 5/2003 | Shinji et al. | |
| 2004/0060573 A1 | 4/2004 | Woods | |
| 2004/0060581 A1 | 4/2004 | Garcia et al. | |
| 2004/0069319 A1 | 4/2004 | Boyd et al. | |
| 2004/0069329 A1 | 4/2004 | De Larios et al. | |
| 2004/0136494 A1 | 7/2004 | Lof et al. | |
| 2004/0178060 A1 | 9/2004 | Ravkin et al. | |
| 2004/0182422 A1 | 9/2004 | Boyd et al. | |
| 2005/0132515 A1 | 6/2005 | Boyd et al. | |
| 2005/0139318 A1 | 6/2005 | Woods et al. | |
| 2005/0145265 A1 | 7/2005 | Ravkin et al. | |
| 2005/0145267 A1 | 7/2005 | Korolik et al. | |
| 2005/0145268 A1 | 7/2005 | Woods | |
| 2005/0148197 A1 | 7/2005 | Woods et al. | |
| 2005/0217703 A1 | 10/2005 | O'Donnell | |
| 2006/0064895 A1 | 3/2006 | Garcia et al. | |

FOREIGN PATENT DOCUMENTS

| | | |
|---|---|---|
| EP | 0 905 747 A1 | 3/1999 |
| EP | 1 489 461 A1 | 12/2004 |
| EP | 1 489 462 A2 | 12/2004 |
| JP | 05837190 | 3/1983 |
| JP | 62150828 A | 7/1987 |
| JP | 02280330 | 11/1990 |
| JP | 02309638 | 12/1990 |
| JP | 08277486 | 10/1996 |
| JP | 11031672 | 2/1999 |
| JP | 11350169 | 12/1999 |
| JP | 2003-151948 | 5/2003 |
| WO | WO 99/16109 A1 | 4/1999 |
| WO | WO 99/49504 | 9/1999 |
| WO | WO 02/001613 A3 | 1/2002 |
| WO | WO 02/32825 A1 | 4/2002 |
| WO | WO 02/101795 A3 | 12/2002 |
| WO | WO 03/014416 A2 | 2/2003 |
| WO | WO 2004/030051 A2 | 4/2004 |

OTHER PUBLICATIONS

Lim et al., *"Atomic Layer deposition of transition metals"*, Department of Chemistry and Chemical Biology, Harvard University, Nature Publishing Group, vol. 2, Nov. 2003, pp. 749-754.

ICKnowledge LLC, *"Technology Backgrounder: Atomic Layer Deposition"*, ICKnowledge.com, 2004, p. 1-7.

*"Chemical vapor deposition"*, Wikipedia, the free encyclopedia, http://en.wikipedia.org/wiki/Chemical_vapor_deposition, 2005, p. 1-2.

Sigma-Aldrich, *"Atomic Layer Deposition (ALD)"*, http://www.sigmaaldrich.com/Area_of_Interest/Chemistry/Materials_Science/Thin_Films, 2005, pp. 1-2.

J.A. Britten, "A moving-zone Marangoni drying process for critical cleaning and wet processing," Oct. 1997, *Solid State Technology*.

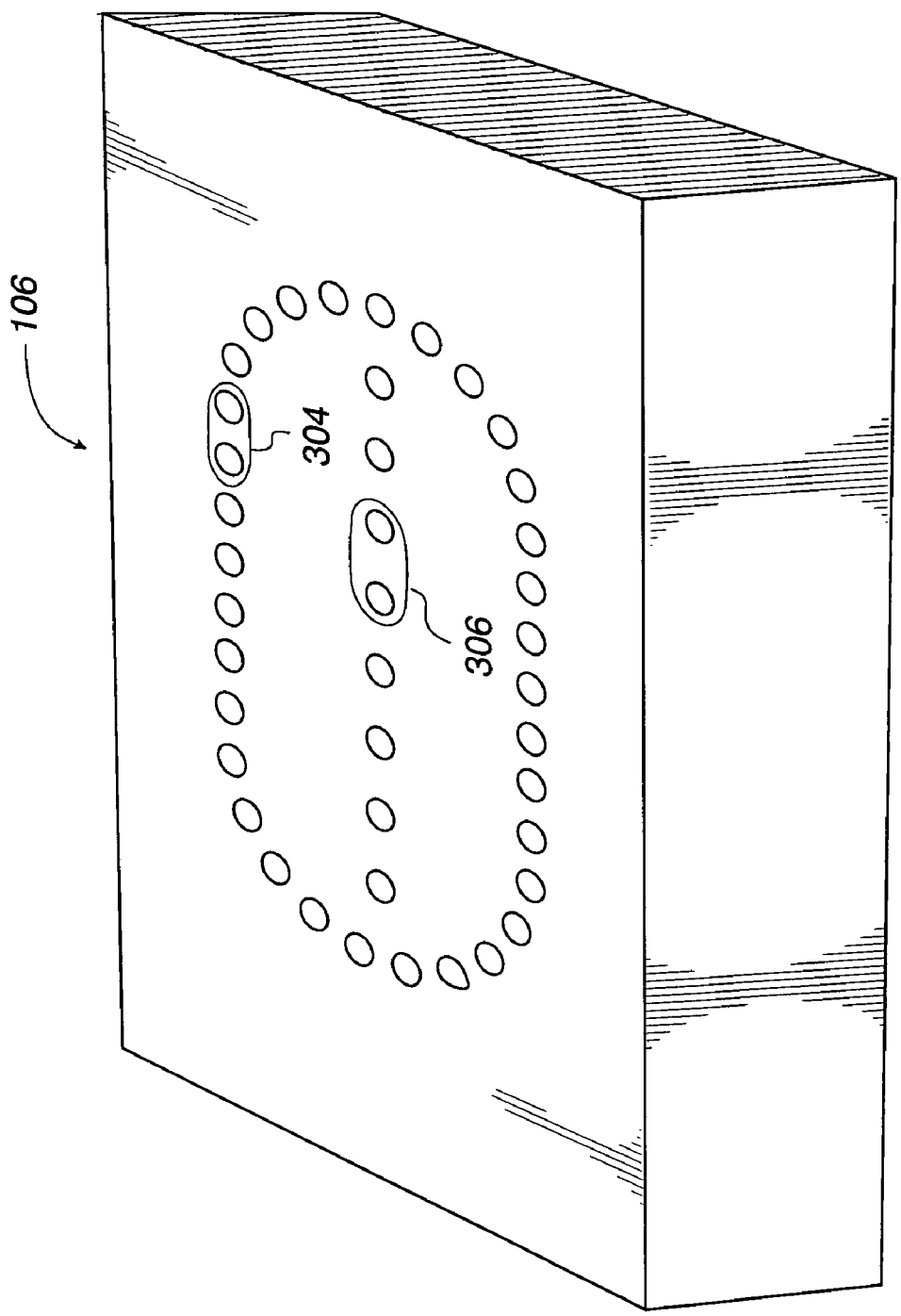

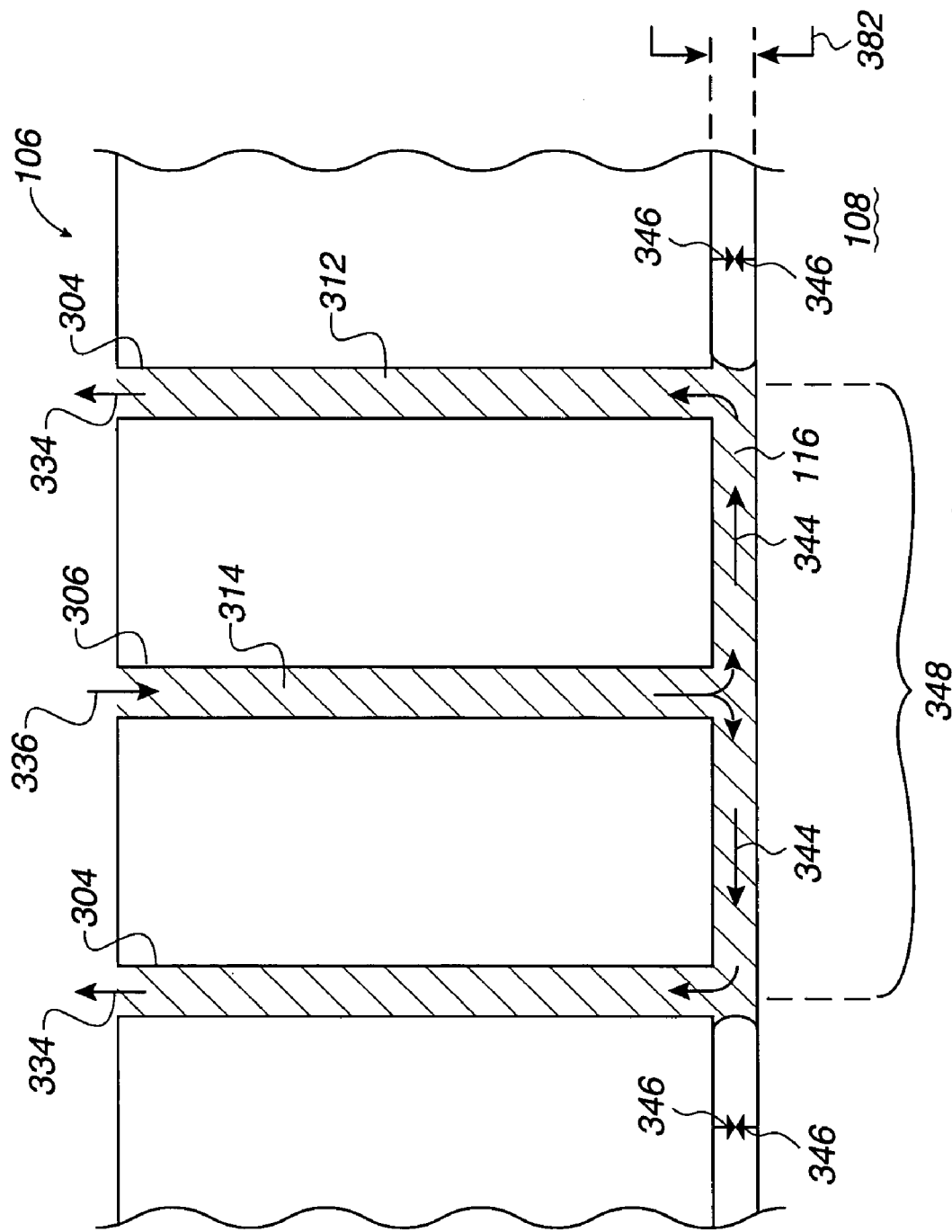

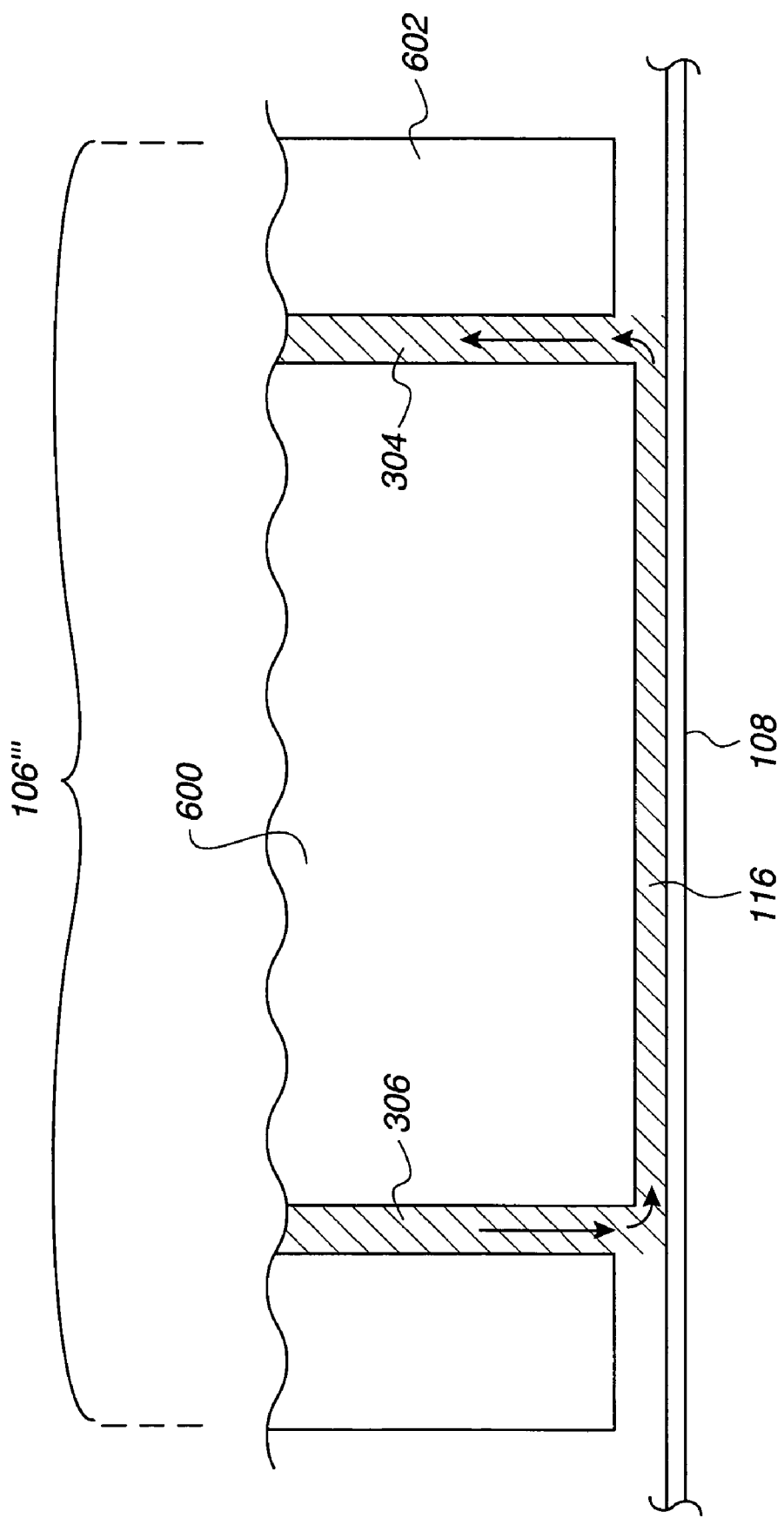

METHOD AND APPARATUS FOR PROCESSING WAFER SURFACES USING THIN, HIGH VELOCITY FLUID LAYER

CROSS REFERENCE To RELATED APPLICATION

This is a continuation-in-part of a co-pending U.S. patent application Ser. No. 10/817,355, from which priority under 35 U.S.C. § 120 is claimed, filed on Apr. 1, 2004 entitled "Substrate Proximity Processing Structures and Methods for Using and Making the Same," which is a continuation-in-part of U.S. patent application Ser. No. 10/261,839, from which priority under 35 U.S.C. § 120 was claimed, entitled "Method and Apparatus for Drying Semiconductor Wafer Surfaces Using a Plurality of Inlets and Outlets Held in Close Proximity to the Wafer Surfaces" filed on Sep. 30, 2002 now U.S. Pat. No. 7,234,477. The aforementioned patent applications are hereby incorporated by reference.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer cleaning cost.

2. Description of the Related Art

In the semiconductor chip fabrication process, it is well-known that there is a need to process a wafer using operations such as cleaning and drying. In each of these types of operations, there is a need to effectively apply and remove fluids for the wafer operation process.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder, which pushes a wafer surface against a rolling belt or a rotating platen. This belt uses a slurry, which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form water spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

FIG. 1A illustrates movement of fluids on a wafer 10 during an SRD process. In this drying process, a wet wafer is rotated at a high rate by rotation 14. In SRD, by use of centrifugal force, the fluid used to rinse the wafer is pulled from the center of the wafer to the outside of the wafer and finally off of the wafer as shown by fluid directional arrows 16. As the fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG 1A, the inside area of the circle formed by the moving liquid/gas interface 12 is free from the fluid and the outside area of the circle formed by the moving liquid/gas interface 12 is the fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid/gas interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (ie., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces. Certain portion of the wafer may have different hydrophobic properties.

FIG. 1B illustrates an exemplary wafer drying process 18. In this example a portion 20 of the wafer 10 has a hydrophilic area and a portion 22 has a hydrophobic area. The portion 20 attracts water so a fluid 26 pools in that area. The portion 22 is hydrophobic so that area repels water and therefore there can be a thinner film of water on that portion of the wafer 10. Therefore, the hydrophobic portions of the wafer 10 often dries more quickly than the hydrophilic portions. This may lead to inconsistent wafer drying that can increase contamination levels and, therefore, decrease wafer production yields.

Therefore, there is a need for a method and an apparatus that avoids the prior art by enabling optimized fluid management and application to a wafer that reduces contaminating deposits on the wafer surface. Such deposits as often occur today reduce the yield of acceptable wafers and increase the cost of manufacturing semiconductor devices.

SUMMARY OF THE INVENTION

Broadly speaking, the present invention fills these needs by providing a substrate processing apparatus that is capable of processing wafer surfaces with a high velocity fluid layer while significantly reducing wafer contamination. It should be appreciated that the present invention can be implemented in numerous ways, including as a process, an apparatus, a system, a device or a method. Several inventive embodiments of the present invention are described below.

In one embodiment, a method for processing a substrate is disclosed which includes generating a fluid layer on a surface of the substrate, the fluid layer defining a fluid meniscus. The generating includes moving a head in proximity to the surface, applying a fluid from the head to the surface while the head is in proximity to the surface of the substrate to define the fluid layer, and removing the fluid from the surface through the proximity head by a vacuum. The fluid travels along the fluid layer between the head and the substrate at a velocity that increases as the head is in closer proximity to the surface.

In another embodiment, an apparatus for processing a substrate is provided which includes a head capable of moving in proximity to a surface of the substrate and generating a fluid layer on the surface of the substrate to define a fluid meniscus. The proximity head includes at least one inlet configured to apply a fluid to the surface of the substrate to define the fluid layer, and at least one outlet configured to remove the fluid from the surface of the substrate. The head is capable of moving the fluid along the fluid layer between the head and the substrate at a velocity that increases as the head is in closer proximity to the surface.

In yet another embodiment, a substrate preparation system is provided which includes a head being capable of being moved in proximity to a substrate surface when in operation, and a first conduit for delivering a fluid to the substrate surface through the head. The system further includes a second conduit for removing the fluid from the substrate surface where the fluid forms a fluid layer over the substrate surface in operation. The fluid travels along the fluid layer between the head and the substrate surface at a velocity that increases as the head is in closer proximity to the substrate surface.

The advantages of the present invention are numerous. Most notably, the apparatuses and methods described herein utilize a fluid meniscus with a high velocity fluid layer to efficiently process (e.g., clean, dry, etc.) substrates by operations which involve optimal management of fluid application and removal from the substrate while reducing unwanted fluids and contaminants remaining on a wafer surface. In one embodiment, by using the high velocity fluid to generate the fluid meniscus, the fluid meniscus can be applied to a substrate/wafer without having to utilize a surface tension reducing gas against a fluid meniscus/atmosphere border. Consequently, wafer processing and production may be increased and higher wafer yields may be achieved due to efficient wafer processing.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 5B shows a perspective view of the proximity head in accordance with one embodiment of the present invention.

FIG. 6A illustrates a side view of the proximity head generating the fluid meniscus with a high velocity fluid layer on the wafer surface in accordance with one embodiment of the present invention.

FIG. 9 illustrates a proximity head with a first piece and a second piece in accordance with one embodiment of the present invention.

DETAILED DESCRIPTION

Figure 1A:
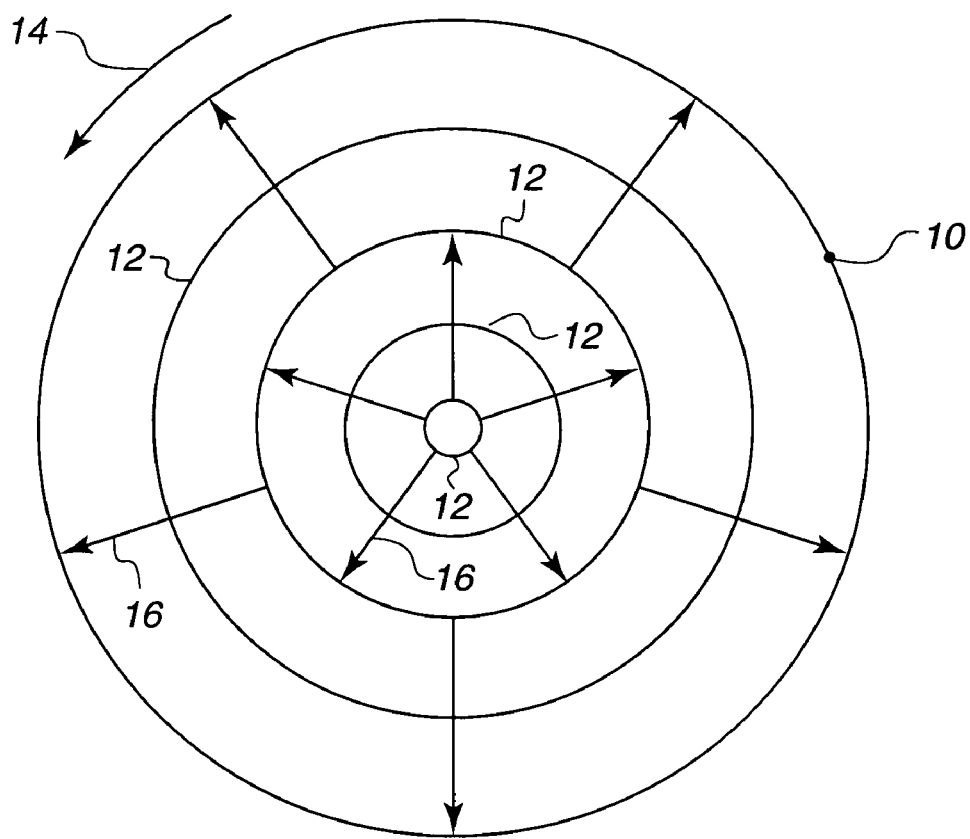
FIG. 1A illustrates movement of cleaning fluids on a wafer during an SRD drying process.
Figure 1B:
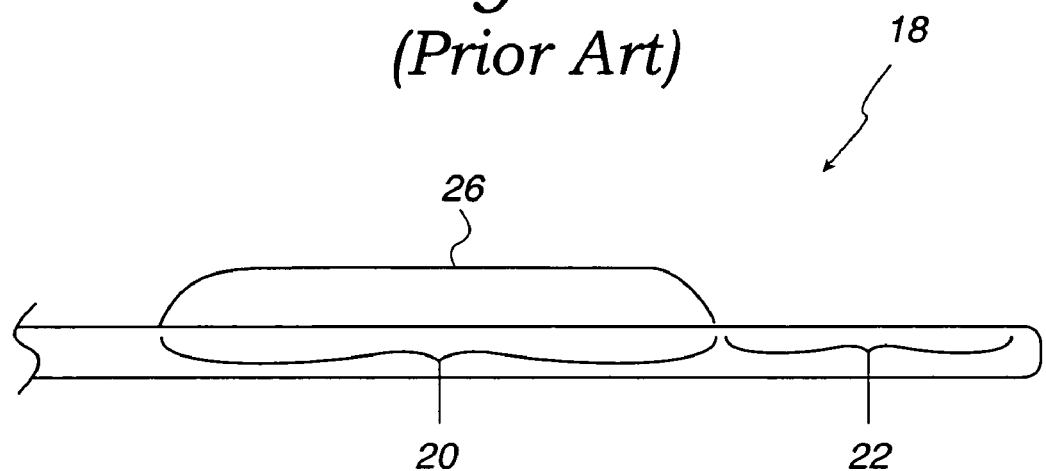
FIG. 1B illustrates an exemplary wafer drying process.

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using proximity head(s) using a high velocity fluid layer to generate one or more of a specific shape, size, and location of fluid menisci. In one embodiment, the high velocity fluid used to generate the fluid meniscus can generate a Bernoulli effect upon the wafer being processed by the fluid meniscus. Therefore, the region of the wafer surface being processed by the fluid meniscus is affected by less force as compared with other regions of the wafer that are not in contact with the fluid meniscus. Consequently, such a force, in effect, generates an almost attractive-like force between the proximity head and the fluid meniscus. Therefore, such as an effect generates a highly manageable and stable fluid meniscus without the need for usage of a surface tension reducing gas to manage the border of the fluid meniscus.

The technology described herein may be utilized to perform any suitable type of combination of types of wafer operation(s) such as, for example drying, etching, plating, etc. It should be appreciated that the systems and proximity heads as described herein are exemplary in nature, and that any other suitable types of configurations that would enable the generation and movement of one or more meniscus may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. Moreover, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer processing system as described herein may be utilized to process any shape and size of substrates such as for example, 200 mm wafers, 300 mm wafers, flat panels, etc.

Moreover, the size of the proximity head and in turn the size of the meniscus (or menisci depending on the embodiment) may vary. In one embodiment, the size of the proximity head and the size(s) of the meniscus (or menisci) may be larger than a wafer being processed, and in another embodiment, the proximity head and the size of the meniscus may be smaller than the wafer being processed. Furthermore, the meniscus as discussed herein may be utilized with other forms of wafer processing technologies such as, for example, brushing, lithography, megasonics, etc.

A fluid meniscus can be supported and moved (e.g., onto, off of and across a wafer) with a proximity head. Various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, EPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," and U.S. patent application Ser. No. 10/742,303 entitled "Proximity Brush Unit Apparatus and Method." The aforementioned patent applications are hereby incorporated by reference in their entirety.

It should be appreciated that the system described herein is just exemplary in nature, and the proximity head as described herein may be used in any suitable system such as, for example, those described in the United States Patent Applications referenced above.

Figure 2:
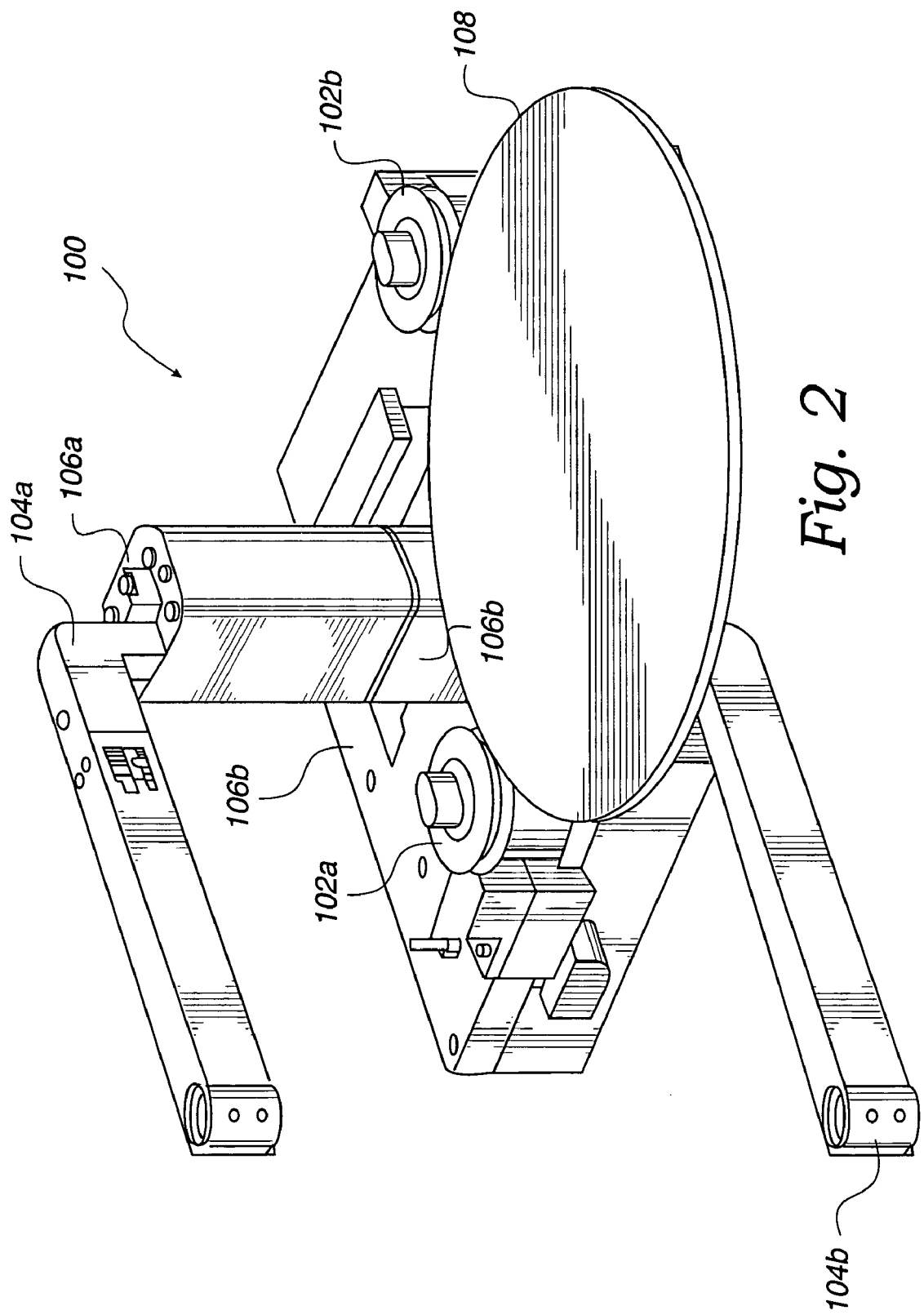
FIG. 2 shows a wafer processing system in accordance with one embodiment of the present invention.

FIG. 2 shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. In one embodiment, the proximity heads 106a and/or 106b may be configured to apply a high velocity fluid layer to a wafer as described below in reference to FIGS. 5A through 9. The proximity heads 106a and 106b may be any suitable apparatus that may generate a fluid meniscus such as, for example, any proximity head as described herein. In another embodiment, the proximity heads 106a and/or 106b may be any suitable proximity head(s) as described herein. The upper arm 104a and the lower arm 104b can be part of an assembly which enables substantially linear movement of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where a meniscus is generated before processing and the meniscus that has already been generated between the proximity heads 106a and 106 may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control a meniscus. It should also be understood that close proximity may be any suitable distance from the wafer as long as a meniscus may be maintained. In one embodiment, the proximity heads 106a and 106b (as well as any other proximity head described herein) may each be located between about 0.1 mm to about 10 mm from the wafer to generate the fluid meniscus on the wafer surface. In a preferable embodiment, the proximity heads 106a and 106b (as well as any other proximity head described herein) may each be located bout 5 microns to about 500 microns from the wafer to generate the fluid meniscus on the wafer surface, and in a more preferable embodiment, the proximity heads 106a and 106b (as well as any other proximity head described herein) may be located about 70 microns from the wafer to generate the fluid meniscus on the wafer surface. In addition, depending on the distance between the fluid meniscus and the wafer surface, the velocity of the fluid that makes up the fluid meniscus may vary.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate a fluid meniscus between the proximity head and the wafer. The fluid meniscus may be moved across the wafer to process the wafer by applying fluid to the wafer surface and removing fluids from the surface. In such a way, depending on the fluids applied to the wafer, cleaning, drying, etching, and/or plating may be accomplished. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration meniscus. The proximity heads can also be configured to process the bevel edge of the wafer in addition to processing the top and/or bottom of the wafer. This can be accomplished by moving the meniscus off (or onto) the edge of the wafer which processes the bevel edge. It should also be understood that the proximity heads 106a and 106b may be the same type of apparatus or different types of proximity heads.

The wafer 108 may be held and rotated by the rollers 102a and 102b in any suitable orientation as long as the orientation enables a desired proximity head to be in close proximity to a portion of the wafer 108 that is to be processed. In one embodiment, the rollers 102a and 102b can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a and 102b serves to move a wafer area that has not been processed into close proximity to the proximity heads 106a and 106b. However, the rotation itself does not dry the wafer or move fluid on the wafer surfaces towards the edge of the wafer. Therefore, in an exemplary wafer processing operation, the unprocessed areas of the wafer would be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary wafer processing embodiment, at least one inlet may be configured to apply a processing fluid to the wafer surface, and at least one outlet a may be configured to remove fluids from a region between the wafer and a particular proximity head by applying vacuum (also known as vacuum outlet). In an optional embodiment, additional inlets may be utilized to apply a surface tension reducing fluid (e.g., isopropyl alcohol vapor in nitrogen gas) to the fluid on the wafer surface. In one embodiment of a drying operation, the at least one inlet may apply deionized water to the wafer surface.

In an exemplary cleaning embodiment, a cleaning solution may be substituted for the DIW. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. In addition, other types of solutions may be inputted into a fluid meniscus on the wafer surface and removed from the fluid meniscus depending on the processing operation desired.

It should be appreciated that the inlets and outlets located on a face of the proximity head may be in any suitable configuration as long as a stable meniscus as described herein may be utilized. In one embodiment, the at least one inlet may be adjacent to the at least one vacuum outlet to form a processing fluid-vacuum orientation where the at least one outlet at least partially surrounds the at least one inlet. It should be appreciated that other types of orientations may be utilized depending on the wafer processes desired and what type of wafer processing mechanism is sought to be enhanced. In a preferable embodiment, the vacuum-processing fluid orientation may be utilized to intelligently and powerfully generate, control, and move the meniscus located between a proximity head and a wafer to process wafers. The processing fluid inlets and the vacuum outlets may be arranged in any suitable manner if the above orientation is maintained. For example, in addition to the vacuum outlet, and the processing fluid inlet, in an additional embodiment, there may be additional sets of processing fluid inlets and/or vacuum outlets depending on the configuration of the proximity head desired. It should be appreciated that the exact configuration of the vacuum-processing fluid orientation may be varied depending on the application. For example, the distance between the vacuum and processing fluid inlet locations may be varied so the distances are consistent or so the distances are inconsistent. In addition, the distances between the vacuum outlet and processing fluid inlet may differ in magnitude depending on the size, shape, and configuration of the proximity head 106a and the desired size of a process meniscus (i.e., meniscus shape and size).

In an optional embodiment, at least one $N_2$/IPA vapor inlet may be adjacent to the at least one vacuum outlet which is in turn adjacent to the at least one processing fluid inlet to form an IPA-vacuum-processing fluid orientation.

In one embodiment, the proximity heads 106a and 106b may be positioned in close proximity to a top surface and a bottom surface respectively of the wafer 108 and may utilize the at least one inlet and the at least one outlet to generate wafer processing meniscuses in contact with the wafer 108 which are capable of processing the top surface and the bottom surface of the wafer 108. At substantially the same time the processing fluid is applied to the wafer surface, a vacuum may be applied in close proximity to the wafer surface to remove the processing fluid and some of the surrounding atmosphere, and/or the fluids that may be on the wafer surface. The portion of the processing fluid that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

Figure 3:
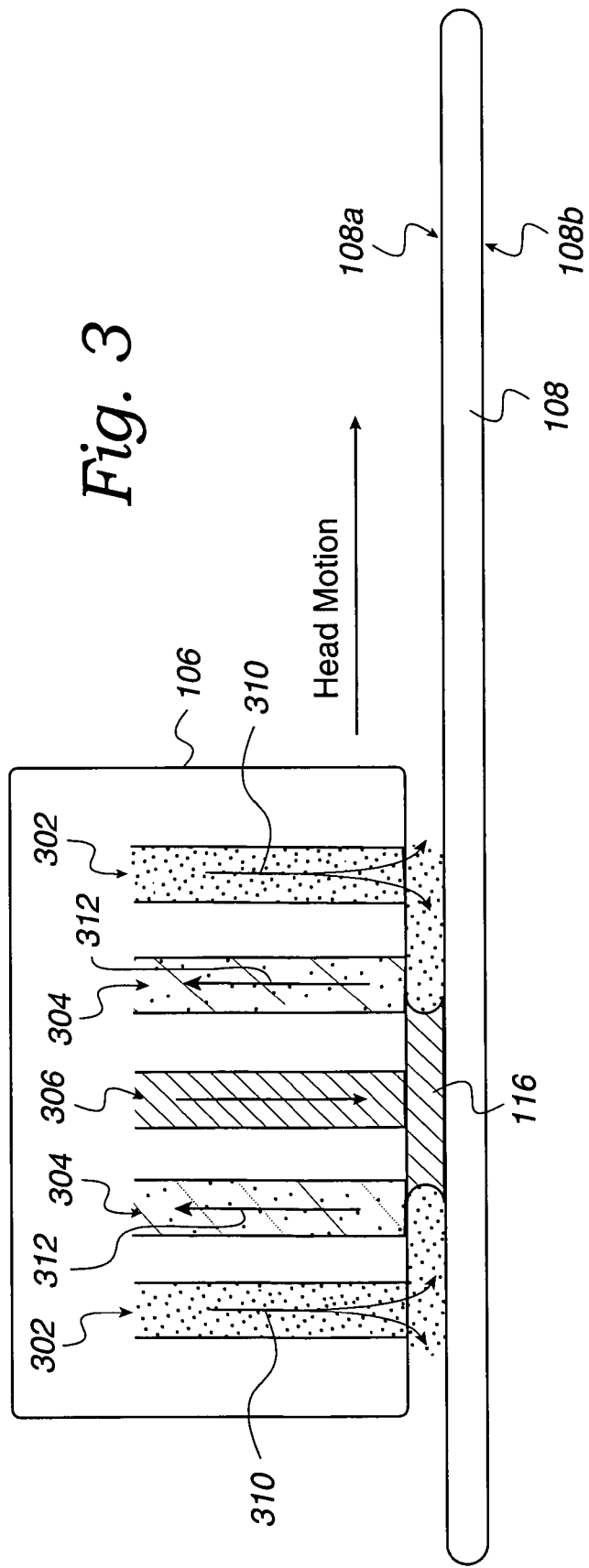
FIG. 3 illustrates a proximity head performing a wafer processing operation in accordance with one embodiment of the present invention.
Figure 4:
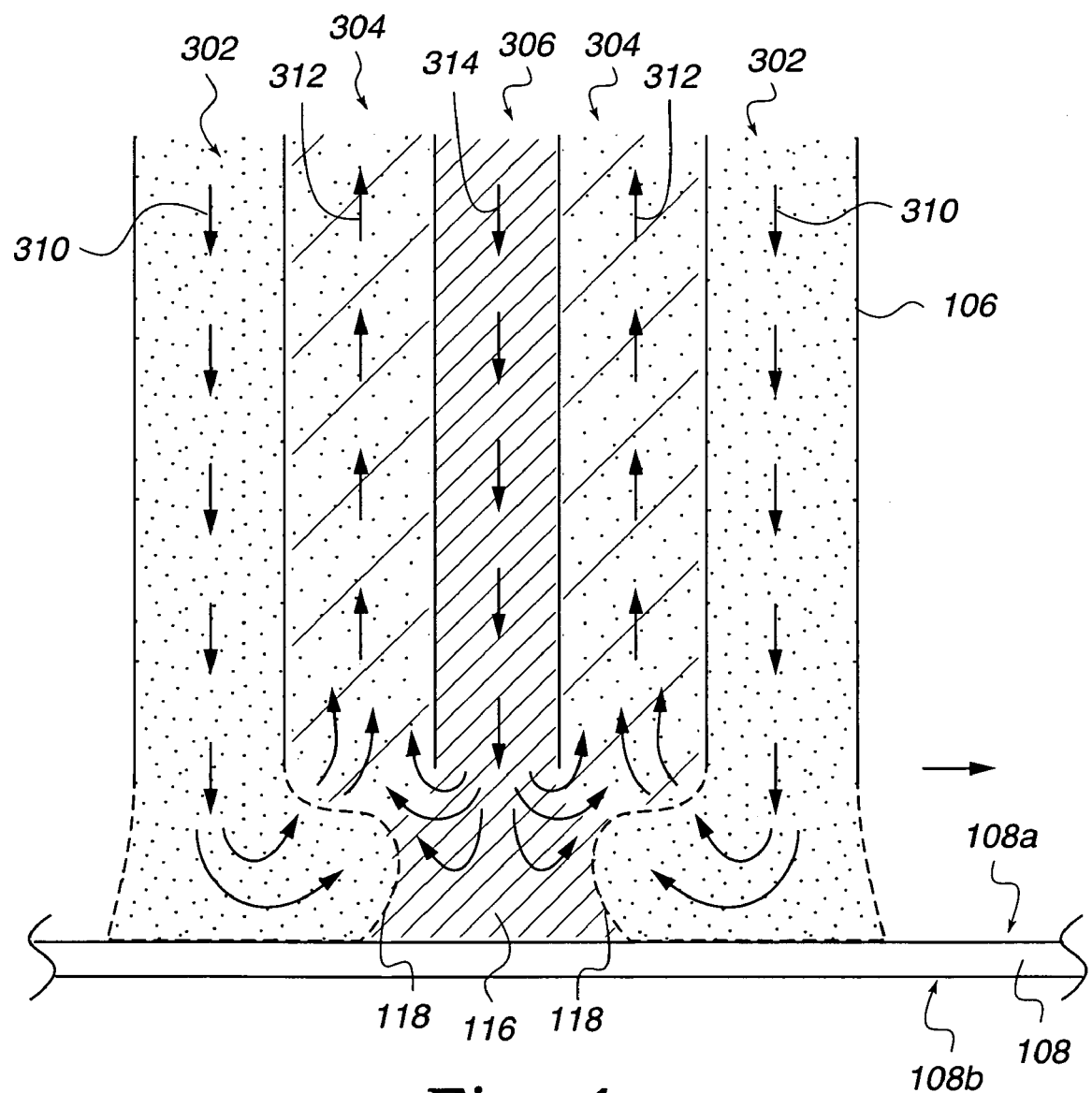
FIG. 4 illustrates a wafer processing operation that may be conducted by a proximity head in accordance with one embodiment of the present invention.

FIG. 3 illustrates a proximity head 106 performing a wafer processing operation in accordance with one embodiment of the present invention. FIGS. 3 through 4B show a method of generating a fluid meniscus by using IPA application. FIGS. 5A through 9 illustrate methods and apparatuses for generating the fluid meniscus without IPA application. The proximity head 106, in one embodiment, moves while in close proximity to a top surface 108a of the wafer 108 to conduct a wafer processing operation. It should be appreciated that the proximity head 106 may also be utilized to process (e.g., clean, dry, plate, etch, etc.) a bottom surface 108b of the wafer 108. In one embodiment, the wafer 108 is rotating so the proximity head 106 may be moved in a linear fashion along the head motion while the top surface 108a is being processed. By applying the IPA 310 through the inlet 302, the vacuum 312 through outlet 304, and the processing fluid 314 through the inlet 306, the meniscus 116 may be generated. It should be appreciated that the orientation of the inlets/outlets as shown in FIG. 3 is only exemplary in nature, and that any suitable inlets/outlets orientation that may produce a stable fluid meniscus may be utilized such as those configurations as described in the United States Patent Applications incorporated by reference previously. In one embodiment, the meniscus 116 with a high velocity fluid layer may be generated. Therefore, as explained further in reference to FIG. 6A, a Bernoulli effect may be generated on the wafer 108 thereby lessening or obviating the need to apply a surface tension reducing fluid (e.g., gas, substance, liquid, etc.) to the boundary of the fluid meniscus 116.

FIG. 4 illustrates a wafer processing operation that may be conducted by a proximity head 106a in accordance with one embodiment of the present invention. It should be appreciated that the application of IPA is optional and that in a preferable embodiment as discussed in reference to FIG. 6A, the fluid meniscus 116 may be produced without application of IPA. Although FIG. 4 shows a top surface 108a being processed, it should be appreciated that the wafer processing may be accomplished in substantially the same way for the bottom surface 108b of the wafer 108. In one embodiment, the inlet 302 may be utilized to apply isopropyl alcohol (IPA) vapor toward a top surface 108a of the wafer 108, and the inlet 306 may be utilized to apply a processing fluid toward the top surface 108a of the wafer 108. In addition, the outlet 304 may be utilized to apply vacuum to a region in close proximity to the wafer surface to remove fluid or vapor that may located on or near the top surface 108a. As described above, it should be appreciated that any suitable combination of inlets and outlets may be utilized as long as the meniscus 116 may be formed. The IPA may be in any suitable form such as, for example, IPA vapor where IPA in vapor form is inputted through use of a $N_2$ gas. Moreover, any suitable fluid used for processing the wafer (e.g., cleaning fluid, drying fluid, etching fluid, plating fluid, etc.) may be utilized that may enable or enhance the wafer processing. In one embodiment, an IPA inflow 310 is provided through the inlet 302, a vacuum 312 may be applied through the outlet 304 and processing fluid inflow 314 may be provided through the inlet 306. Consequently, if a fluid film resides on the wafer 108, a first fluid pressure may be applied to the wafer surface by the IPA inflow 310, a second fluid pressure may be applied to the wafer surface by the processing fluid inflow 314, and a third fluid pressure may be applied by the vacuum 312 to remove the processing fluid, IPA and the fluid film on the wafer surface.

Therefore, in one embodiment of a wafer processing, as the processing fluid inflow 314 and the IPA inflow 310 is applied toward a wafer surface, fluid (if any) on the wafer surface is intermixed with the processing inflow 314. At this time, the processing fluid inflow 314 that is applied toward the wafer surface encounters the IPA inflow 310. The IPA forms an interface 118 (also known as an IPA/processing fluid interface 118) with the processing fluid inflow 314 and along with the vacuum 312 assists in the removal of the processing fluid inflow 314 along with any other fluid from the surface of the wafer 108. In one embodiment, the IPA/processing fluid interface 118 reduces the surface of tension of the processing fluid. In operation, the processing fluid is applied toward the wafer surface and almost immediately removed along with fluid on the wafer surface by the vacuum applied by the outlet 304. The processing fluid that is applied toward the wafer surface and for a moment resides in the region between a proximity head and the wafer surface along with any fluid on the wafer surface forms a meniscus 116 where the borders of the meniscus 116 are the IPA/processing fluid interfaces 118. Therefore, the meniscus 116 is a constant flow of fluid being applied toward the surface and being removed at substantially the same time with any fluid on the wafer surface. The nearly immediate removal of the processing fluid from the wafer surface prevents the formation of fluid droplets on the region of the wafer surface being dried thereby reducing the possibility of contamination on the wafer 108 after the processing fluid has accomplished its purpose depending on the operation (e.g., etching, cleaning, drying, plating, etc.). The pressure (which is caused by the flow rate of the IPA) of the downward injection of IPA also helps contain the meniscus 116.

The flow rate of the N2 carrier gas containing the IPA may assist in causing a shift or a push of processing fluid flow out of the region between the proximity head and the wafer surface and into the outlets 304 (vacuum outlets) through which the fluids may be outputted from the proximity head. It is noted that the push of processing fluid flow is not a process requirement but can be used to optimize meniscus boundary control. Therefore, as the IPA and the processing fluid is pulled into the outlets 304, the boundary making up the IPA/processing fluid interface 118 is not a continuous boundary because gas (e.g., air) is being pulled into the outlets 304 along with the fluids. In one embodiment, as the vacuum from the outlets 304 pulls the processing fluid, IPA, and the fluid on the wafer surface, the flow into the outlets 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/processing fluid or processing fluid only interface 118. It should also be understood that the any suitable number of inlets 302, outlets 304 and inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet. It should be appreciated that any suitable flow rate may be utilized for the processing fluid and vacuum as long as the high velocity fluid layer making up the meniscus 116 can be maintained. It should be understood that the flow rate of fluids may vary depending on the size of the proximity head as long as the fluid meniscus 116 can maintain a Bernoulli type effect on the wafer surface. Specific flow rates that may be utilized is discussed in further detail in reference to FIG. 6A below. In one embodiment a larger head may have a greater rate of fluid flow than smaller proximity heads. This may occur because larger proximity heads, in one embodiment, have more inlets 306 and outlets 304.

It should be appreciated that any suitable type of wafer processing operation may be conducted using the meniscus depending on the processing fluid utilized. For example, a cleaning fluid such as, for example, SC-1, SC-2, etc., may be used for the processing fluid to generate wafer cleaning operation. In a similar fashion, different fluids may be utilized and similar inlet and outlet configurations may be utilized so the wafer processing meniscus may also etch and/or plate the wafer. In one embodiment, etching fluids such as, for example, HF, EKC proprietary solution, KOH etc., may be utilized to etch the wafer. In another embodiment, plating fluids such as, for example, Cu Sulfate, Au Chloride, Ag Sulfate, etc. in conjunction with electrical input may be applied.

FIG. 5A through 9 shows embodiments of the proximity head 106 that may have at least one inlet for applying a processing fluid to the wafer and removing the processing fluid through at least one outlet. The preferable embodiments as discussed in reference to FIGS. 5A to 9 may produce a stable and movable fluid meniscus without the need for application of IPA. In one exemplary embodiment, the proximity head may generate the fluid meniscus by applying a high velocity fluid layer on the wafer surface through the at least one inlet and removing the fluid from the high velocity fluid layer though the at least one outlet. By applying the high velocity fluid layer between the proximity head and the wafer surface, a Bernoulli type effect may be generated so a low downforce region may be created on the region of the wafer surface in contact with the fluid meniscus. As the fluid is applied to the wafer surface, in one embodiment, the combination of the vacuum from the outlet and the small gap between the proximity head and the wafer surface may generate the higher velocity of the fluid making up the high velocity fluid layer. Therefore, the fluid of the fluid meniscus travels at a high velocity over the wafer surface where the higher velocity is generated by a vacuum removing the fluid and by the fluid traveling in a small gap between the proximity head and the substrate surface. As the gap becomes between the proximity head and the wafer surface smaller, the velocity of the fluid making up the high velocity fluid layer may increase. Consequently, the low downforce region may in effect pull the proximity head and the wafer towards each other until an equilibrium distance is achieved between the wafer surface and the processing surface of the proximity head. The fluid meniscus thereby generated can apply and remove fluid from the surface of the wafer in an optimal manner without leaving fluid droplets while leaving highly reduced levels of contamination on the wafer surface.

Figure 5A:
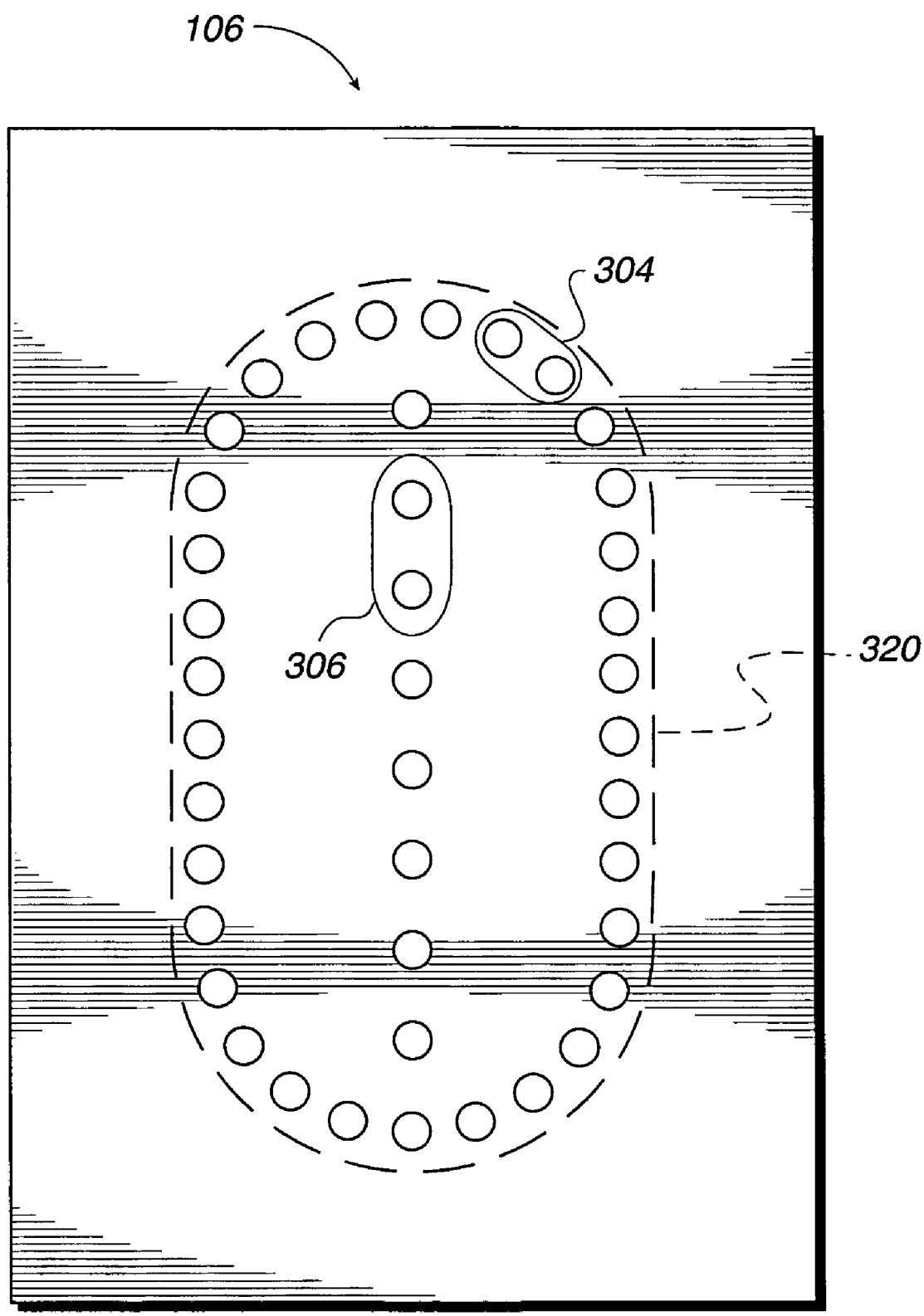
FIG. 5A illustrates a top view of a proximity head in accordance with one embodiment of the present invention.

FIG. 5A illustrates a top view of a proximity head 106' in accordance with one embodiment of the present invention. The proximity head 106' includes a processing region 320 that includes an area with a plurality of inlets 306 and a plurality of outlets 304. In one embodiment, the plurality of inlets 306 is configured to be capable of applying a processing fluid to the wafer surface at a flow rate to generate a fluid layer of high velocity on the wafer surface. The plurality of outlets 304, in one embodiment, applies vacuum to a border of the fluid meniscus and removes some of the fluid from the fluid meniscus that was inputted by the plurality of inlets 306. As described in further detail in reference to FIG. 6A, the high velocity fluid on the wafer surface is a fluid meniscus on the wafer surface that can generate any suitable type of wafer surface processing depending on the processing fluid utilized. In addition, in an embodiment where the proximity head 106' is above the wafer 108, the high velocity fluid layer through both surface tension and the Bernoulli type effect is held in place under the processing region to generate the fluid meniscus. Therefore there is low pressure in between the proximity head and the wafer 108 because the fluid moving in the fluid meniscus is moving so rapidly, and this low pressure generates attachment of the wafer 108 to the proximity head with the fluid meniscus operating as a fluid bearing. In addition, this generation of a stable and very thin fluid meniscus obviates the need for another source outlet to apply a surface tension reducing fluid such as for example, IPA vapor.

FIG. 5B shows a perspective view of the proximity head 106' in accordance with one embodiment of the present invention. In one embodiment, the proximity head 106' includes a row of inlets 306 that is substantially surrounded by the plurality of outlets 304. Therefore, as the processing fluid is applied to the wafer surface from the row of inlets 306, the fluid with a high velocity forms a layer on the wafer surface to generate the Bernoulli-type effect. It should be appreciated that the proximity head 106' may be any suitable size and shape as long as a fluid meniscus with a high velocity fluid layer may be generated. In one embodiment, the proximity head 106' may be smaller than a wafer and may be scanned on the wafer for processing operations. In another embodiment, the proximity head 106' may have a length that is longer than a diameter of the wafer. In such an embodiment, as discussed in reference to FIG. 7, the proximity head 106 can process an entire surface of the wafer by scanning once over the wafer. In addition, it should be appreciated that the proximity head 106' may be made from any suitable material such as, plastics, sapphire, quartz, metal. In addition, the proximity head 106' may be made from multiple materials. In one embodiment, as shown below in reference to FIG. 9, the process region of the proximity head 106' can be made from an extremely structurally and chemically stable material such as, for example, sapphire, and the rest of the proximity head can be made from plastics.

FIG. 6A illustrates a side view of the proximity head 106' generating the fluid meniscus 116 with a high velocity fluid layer on the wafer surface in accordance with one embodiment of the present invention. The proximity head 106' applies a processing fluid to the wafer surface through the inlets 306 as shown by processing fluid application 336. The processing fluid is applied at a high velocity so a high velocity fluid layer is formed which in essence is the fluid meniscus 116. The movement of the fluid layer at a high velocity is shown by the direction arrows 344. The processing fluid that has been applied to the wafer surface is removed by a vacuum 334 through the outlets 304.

In another embodiment, the vacuum 334 can only be used in one of the source outlets 304 that is shown. It should be appreciated that the volume of the processing fluid applied per unit time through the inlets 306 is substantially equivalent to the processing fluid removed per unit time through the outlets 304. In essence, once the a fluid meniscus 116 has been established between the proximity head 106' and the wafer 108, in one embodiment, a steady state of fluid inflow through the source inlet 306 and fluid outflow through source outlet 304 may keep the meniscus stable. Therefore, the vacuum applied through the outlets 304 and the flow rate of the processing applied through the inlets 306 may be coordinated so substantially the same amount of fluid is inputted into the fluid meniscus 116 per unit time as the amount of fluid removed from the fluid meniscus 116 per unit time.

The flow rate of fluid in direction 344 is proportional to velocity of the fluid multiplied by the height (e.g., height of the space between the proximity head 106' and the wafer 108). Therefore, by increasing the flow rate into the source inlets 306 and increasing the fluid removal from the source outlets 304, a high velocity of fluid may be generated between the proximity head 106' and the wafer 108 thereby obtaining the height which varies with fluid velocity. In addition, the height may be set at a certain point and the flow may be kept constant thereby increasing fluid velocity to generate a low pressure region between the wafer 108 and the proximity head 106'. Therefore, the higher the velocity of the fluid the smaller the height. Therefore, the smaller the gap between the proximity head and the wafer surface, the higher the velocity rate of the fluid on the wafer surface assuming the flow rate is kept constant. Therefore, in one embodiment, in the region between the inlets 306 and the outlets 304, the fluid travels at a higher velocity in a higher velocity fluid region 348. Consequently, this generates a low pressure area over the wafer surface that is being processed by the fluid meniscus 116. This low pressure area compared to the high pressure area surrounding this region generates an attractive force between the proximity head 106' and the wafer 108.

Through the Bernoulli type effect generated by the high velocity fluid layer and through surface tension, the fluid meniscus 116 can be extremely stable and moveable across the wafer surface without meniscus degradation. In addition, the Bernoulli-type effect generated on the wafer surface generates a force 346 between the proximity head 106' and the wafer 108 that keeps the proximity head 106 within close proximity of the wafer 108. Therefore, in one embodiment, depending on the velocity of the fluid in the fluid layer making up the fluid meniscus 116, a distance 382 between the proximity head 116 and the wafer 108 may be varied.

A particular fluid velocity within a particular path may generate different types of low pressure zones. Therefore, by applying fluid at a higher and higher flow rate into the fluid meniscus 116, the low pressure area may be made into an even lower pressure area, thereby, increasing the attraction between the wafer 108 and the proximity head 106'. Therefore, by controlling the fluid velocity within the fluid meniscus 116, the amount of low pressure between the wafer 108 and the proximity head 106' may be regulated. As a result, by applying a fluid at a particular velocity through the fluid meniscus 116, a particular level of low pressure may be attained. Consequently, the pressure against the backside of the wafer may stay constant but the pressure on the front side (the side with the fluid meniscus) is lowered. Therefore, the pressure on the backside of the wafer 108 pushes the wafer in the direction against the proximity head 106'.

Because the amount of low pressure correlates to the amount of attractive force between the proximity head 106' and the fluid meniscus 116, the space between the proximity head 106 and the wafer 108 may be varied by fluid velocity. In a different embodiment, the distance 382 may be set and an optimal processing fluid velocity in the direction 344 may be utilized to generate optimal fluid meniscus cohesion.

Moreover, by applying the high velocity fluid to generate the fluid meniscus 116, the low pressure region generated by the high velocity fluid can move the wafer 108, positioning the wafer 108, and aligning the wafer 108.

In addition, by decreasing the height to a very short distance, the flow rates can be low and still obtain a high velocity fluid. Therefore, a smaller amount of fluid can be used for wafer processing. This can save costs of wafer processing and enhance wafer processing operations. It should also be appreciated that the proximity head 106' may use any suitable type of fluid to generate the fluid meniscus 116. Consequently, depending on the fluid utilized any suitable type of wafer processing operation may be conducted such as, for example, etching, cleaning, rinsing, drying, etc. Moreover, the fluid meniscus 116 may process a dry or a wet surface depending on the conduit configuration on the processing surface of the proximity head 106'.

Therefore, depending on the wafer processing operation desired, the distance 382 may be any suitable distance as long as the fluid meniscus 116 with the high velocity fluid layer may be generated between the proximity head 106 and the wafer 108. In one embodiment, the distance 382 is between about 5 microns and about 500 microns. In another embodiment, the distance 382 may be about 50 microns to about 200 microns while in a preferable embodiment, the distance 382 may be about 70 microns. In addition, the velocity of the fluid when traveling between the inlet and the outlet may be between 5 cm/sec and 200 cm/sec. In another embodiment, proximity head is capable of moving the fluid along the wafer surface from the inlet to the outlet with a velocity of between 10 cm/sec and 100 cm/sec.

The flow rate of fluids and the height (e.g., distance between the proximity head 106' and the wafer 108) of the fluid meniscus have a relationship as shown below in Table 1.

TABLE 1

Velocity = Flow/2(LH)

As utilized in the equation as shown in Table 1, L is the length of the meniscus 116 and the H is the height of the fluid meniscus. It should be appreciated that depending on the wafer processing operation desired, the fluid meniscus 116 may be of any suitable dimensions. The following dimensions for the fluid meniscus 116 is utilized purely for exemplary purposes and should not be construed to limit the fluid meniscus to such dimensions. In one embodiment, the fluid meniscus 116 may have a length of 50 mm and the width is about 0.25 inch. By using the equation as shown in Table 1, if the height H is 1.5 mm a velocity of 10 cm/s is obtained at a flow rate of 1000 ml/min, a velocity of 5 cm/sec is obtained at a flow rate of 500 ml/min and a velocity of 1 cm/s is obtained at a flow rate of 100 ml/min. In another example, if the height of the fluid meniscus (e.g., the gap between the proximity head 106 and the wafer 108) is about 0.005 cm then a velocity of 167 cm/s is obtained at a flow rate of 1 L/min, a velocity of 83 cm/s is obtained for a flow rate of 500 ml/min and a velocity of 17 cm/sec is obtained for a flow rate of 100 ml/min. The exemplary calculations were made purely for exemplary purposes and it should be appreciated that depending on the dimensions of the fluid meniscus 116, the above calculations may change.

Figure 6B:
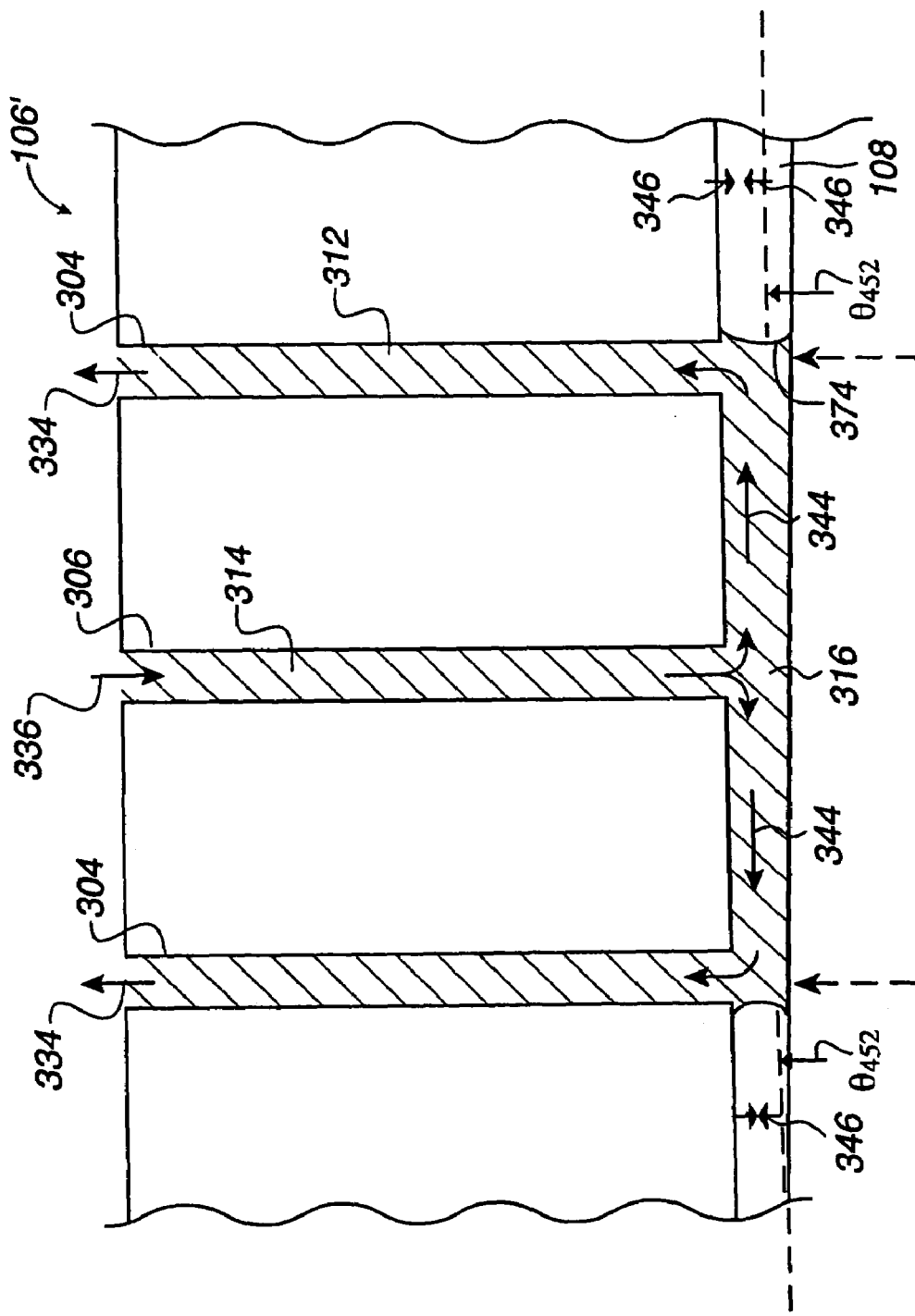
FIG. 6B shows a proximity head that is angled in comparison to a plane of the wafer in accordance with one embodiment of the present invention.

FIG. 6B shows a proximity head 106' that is angled in comparison to a plane of the wafer 108 in accordance with one embodiment of the present invention. In one embodiment, the proximity head 106' is angled at an angle $\theta_{452}$ where the distance between the proximity head 106' and the wafer 108 can vary depending on the configuration and process operation desired. The angle $\theta_{452}$ may be any suitable angle as long as the fluid meniscus 116 may be formed on the wafer surface. In one embodiment, the angle $\theta_{452}$ may be between 0 and two degrees. In another embodiment, the angle $\theta_{452}$ may be between 2 and 10 degrees and in a preferable embodiment, the $\theta_{452}$ is about 0.3 degree angle.

By having an angle $\theta_{452}$, the shape of the meniscus 116 may be changed. In one embodiment, by including the angle $\theta_{452}$, the proximity head 106' may be optimized to operate in a particular direction. For example, as shown in FIG. 6B, the right side of the proximity head 106' is raised higher than the left side of the proximity head 106'. Therefore, the fluid meniscus 316 generated by the proximity head 106' has a larger height on the right side than the left side. In such an embodiment, the fluid meniscus 316 may have an optimal movement pattern to the left (e.g., thinner end of the fluid meniscus 316 is the leading end) and the wafer surface to be processed will encounter the left side of the fluid meniscus 316 first. In that case, the right side of the fluid meniscus 316 would leave the processed area last.

Because of the fluid-air interaction at the border 374 of the right side of the fluid meniscus 316 as shown, the processed region of the wafer surface is left dried in a more effective manner than if the right side of the fluid meniscus 316 were the last to contact the processed region. In addition, in the configuration shown in FIG. 6B, when the leading edge of the fluid meniscus 316 is the side with the thinner layer of fluid, the proximity head 106' may be moved in a faster manner so more wafer area can be processed in a certain span of time. In one embodiment, the wafer 108 may be held in a rigid manner so the distance between any part of the proximity head 106' and the wafer 108 does not change. In this way, the processing environment may be kept at a constant.

Figure 7:
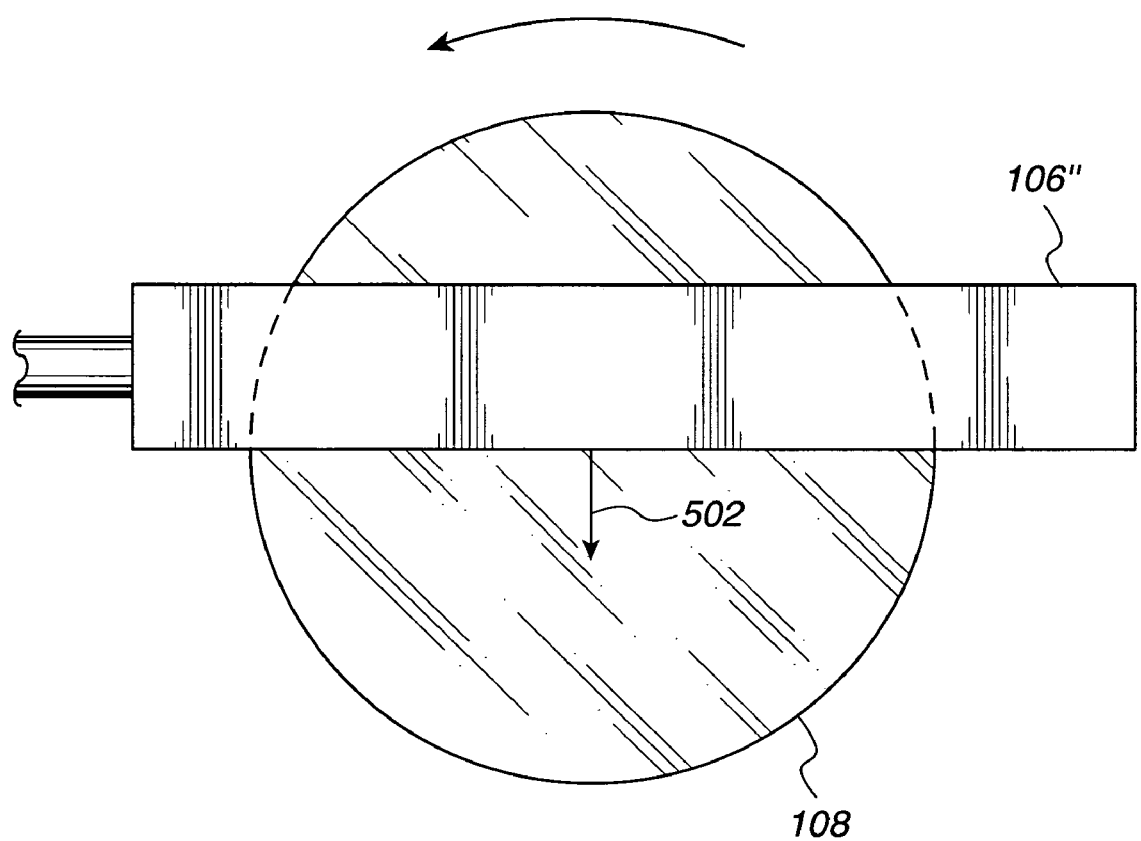
FIG. 7 shows a proximity head that extends over a diameter of the wafer in accordance with one embodiment of the present invention.

FIG. 7 shows a proximity head 106" that extends over a diameter of the wafer 108 in accordance with one embodiment of the present invention. In one embodiment, the proximity head 106" can start from one end of the wafer 108 and move down the diameter of the wafer 108 in a direction 502 to process the wafer 108. In one embodiment there may be a proximity head above and below the wafer so the fluid meniscus 116 can be formed between the proximity heads.

Figure 8:
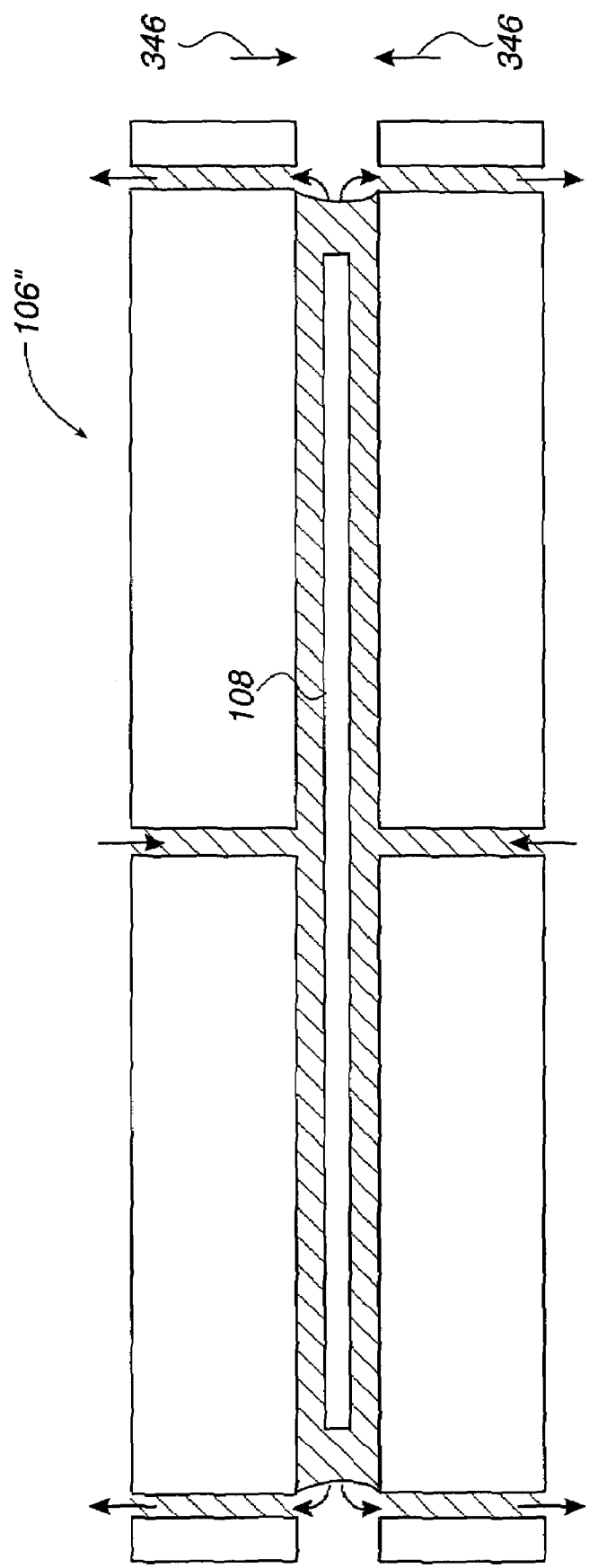
FIG. 8 depicts the proximity heads that are in the process of operating on the wafer in accordance with on embodiment of the present invention.

FIG. 8 depicts the proximity heads 106a" and 106b " that are in the process of operating on the wafer 108 in accordance with on embodiment of the present invention. In one embodiment of the proximity heads 106a " and 106b, " the inlets 306 of the proximity heads 106a " and 106b " generate the high velocity fluid layer between the proximity heads 106a " and 106b " and fluid meniscus 116 through the processing fluid application. A distance 346 may separate the proximity head 106a " and 106b " and therefore, the fluid meniscus may be generated with a height that is the distance 346. The high velocity fluid layer may generate a low pressure region between the proximity heads 106a " and 106b " thereby generating an attractive force between the proximity heads 106a " and 106b". Therefore, the fluid meniscus generated by the proximity heads 106a " may be extremely thin depending on the velocity of the fluid that makes up the fluid meniscus. Because of the low pressure region generated between the proximity heads 106a " and 106b", the fluid meniscus is extremely stable and moveable. In addition, the generated fluid meniscus in motion does not leave water droplets and leaves a processed surface dry and without contaminants thereby enhancing wafer processing operations.

FIG. 9 illustrates a proximity head 106''' with a first piece and a second piece in accordance with one embodiment of the present invention. In one embodiment, the proximity head 106''' may include a first piece 600 that is configured to be in close proximity to the wafer 108 and a second piece 602 that may surround the first piece 600. In such an embodiment, the first piece 600 may be a material with tight tolerance capabilities such as, for example, sapphire. The second piece 602 may be a material that is easier to configure such as, for example, plastics, PET, etc. The first piece 600 and the second piece 602 may be either bolted together or glued together by adhesives. In one embodiment, the first piece 600 and the second piece 602 may be configured so the first piece 600 is in closer proximity to the wafer 108 than the second piece 602. In this fashion, the section of the proximity head 106''' with the highest dimensional tolerance may be placed in the processing region where the fluid meniscus 116 is generated.

In one embodiment, the proximity head 106''' may include at least one source inlet 306 and at least one source outlet 304. The at least one source inlet 306 may apply a processing fluid to a surface of the wafer 108. The fluid may then form the fluid meniscus 116 while traveling in a high velocity layer towards the source outlet 304 which may utilize vacuum to remove the fluid from the surface of the wafer 108. In this way a high velocity layer that is thin may be generated on the wafer surface between the wafer and the proximity head 106'''. Therefore, a Bernoulli effect may be generated on the wafer surface thereby stabilizing the fluid meniscus 116 and enabling movement of the fluid meniscus 116 over the wafer surface without leaving droplets or contaminants through the optimal removal of fluid from the wafer surface.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for processing a substrate, comprising:
a head capable of moving in proximity to a surface of the substrate and generating a fluid layer on the surface of the substrate to define a fluid meniscus, the proximity head including,
a head surface having flat surface regions;
at least one inlet defined in the head surface for applying a fluid to the surface of the substrate to define the fluid layer,
at least one outlet defined in the head surface for removing the fluid from the surface of the substrate;
wherein the head is defined to move the fluid along the fluid layer between the head surface and the substrate at a velocity that increases as the head is in closer proximity to the surface, and the head surface is defined so that the at least one inlet and at least one outlet are defined by discrete holes that reside at the head surface and extend through the flat surface regions of the head surface.

2. An apparatus for processing a substrate as recited in claim 1, wherein the head is configured to move to between about 5 microns and about 500 microns in distance from the surface in operation.

3. An apparatus for processing a substrate as recited in claim 1, wherein head is capable of applying the fluid to the surface at a flow rate of between about 50 ml/sec to about 4000 ml/sec.

4. An apparatus for processing a substrate as recited in claim 1, wherein the fluid meniscus conducts one of an etching operation, cleaning operation, plating operation, and a drying operation.

5. An apparatus for processing a substrate as recited in claim 1, wherein the outlet applies vacuum to remove the fluid from the surface.

6. An apparatus for processing a substrate as recited in claim 1, wherein the head is capable of moving the fluid along the surface of the substrate from the inlet to the outlet with a velocity of between 10 cm/sec and 100 cm/sec.

7. An apparatus for processing a substrate as recited in claim 1, wherein the fluid layer includes one of an etching fluid, a plating fluid, a cleaning fluid, and a rinsing fluid.

8. An apparatus for processing a substrate as recited in claim 1, further comprising,
an additional inlet capable of applying a surface tension reducing fluid to a border of the fluid meniscus.

9. An apparatus for processing a substrate as recited in claim 1, wherein the surface tension reducing fluid is an isopropyl alcohol vapor in nitrogen gas.

10. A substrate preparation system, comprising:
a head having a head surface with flat surface regions, the head capable of being moved in proximity to a substrate surface when in operation;
a first conduit defined at the head surface for delivering a fluid to the substrate surface through the head; and
a second conduit defined at the head surface for removing the fluid from the substrate surface, the fluid forming a fluid layer over the substrate surface in operation;
wherein the fluid travels along the fluid layer between the head surface and the substrate surface at a velocity that increases as the head is in closer proximity to the substrate surface and the head surface is such that the first conduit and second conduit are defined by discrete holes that reside at the head surface and extend through the flat surface regions of the head surface.

11. A substrate preparation system as recited in claim 10, wherein the head is configured to move to between about 5 microns and about 500 microns in distance from the substrate surface in operation.

12. A substrate preparation system as recited in claim 10, wherein the head is capable of applying the fluid at a flow rate of between about 10 cm/sec to about 100 cm/sec.

13. A substrate preparation system as recited in claim 10, wherein the fluid layer conducts one of an etching operation, cleaning operation, plating operation, and a drying operation.

14. A substrate preparation system as recited in claim 10, wherein the second conduit applies vacuum to remove the fluid from the substrate surface.

15. A substrate preparation system as recited in claim 10, wherein the fluid is one of an etching fluid, a plating fluid, a cleaning fluid, and a rinsing fluid.

16. A substrate preparation system as recited in claim 10, further comprising,
an additional inlet capable of applying a surface tension reducing fluid to the substrate surface.

17. A substrate preparation system as recited in claim 16, wherein the surface tension reducing fluid is an isopropyl alcohol vapor in nitrogen gas.

* * * * *